(12) United States Patent
Conroy et al.

(10) Patent No.: US 9,154,153 B2
(45) Date of Patent: Oct. 6, 2015

(54) OFFSET COMPENSATION IN DRIVING CIRCUITS

(75) Inventors: Michael J. Conroy, North Vancouver (CA); Miroslaw Marek Grotkowski, North Vancouver (CA)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/397,936

(22) PCT Filed: May 4, 2012

(86) PCT No.: PCT/CA2012/050297
§ 371 (c)(1),
(2), (4) Date: Oct. 30, 2014

(87) PCT Pub. No.: WO2013/163723
PCT Pub. Date: Nov. 7, 2013

(65) Prior Publication Data
US 2015/0115832 A1    Apr. 30, 2015

(51) Int. Cl.
*G05F 1/00*    (2006.01)
*H05B 37/02*   (2006.01)
*H05B 41/36*   (2006.01)
*H05B 39/04*   (2006.01)
*H03M 1/70*    (2006.01)
*G05F 1/56*    (2006.01)
*H02M 3/156*   (2006.01)
*H05B 33/08*   (2006.01)

(52) U.S. Cl.
CPC . *H03M 1/70* (2013.01); *G05F 1/56* (2013.01); *H02M 3/156* (2013.01); *H05B 33/0815* (2013.01)

(58) Field of Classification Search
None
See application file for complete search history.

(56) References Cited

U.S. PATENT DOCUMENTS

| 7,355,536 | B2 | 4/2008 | Dempsey et al. |
| 7,952,507 | B2 | 5/2011 | Katsis et al. |
| 8,130,323 | B2 | 3/2012 | Hilder |
| 2004/0245946 | A1* | 12/2004 | Halter ............... 315/312 |
| 2009/0174338 | A1* | 7/2009 | Muramatsu ......... 315/250 |

FOREIGN PATENT DOCUMENTS

CA    2167060 A1    1/1995

* cited by examiner

*Primary Examiner* — Anh Tran
(74) *Attorney, Agent, or Firm* — Yuliya Mathis (57) ABSTRACT

Apparatus and methods are presented for compensating for offsets in digital-to-analog converters (DACs). An apparatus may comprise a gain block. The non-inverting input of the gain block may be provided with a bias voltage selected to exceed the worst-case expected positive offset of a DAC. Feedback from the output of the gain block may be provided to a processor. The processor may be connected to drive the DAC.

22 Claims, 6 Drawing Sheets

OFFSET COMPENSATION IN DRIVING CIRCUITS

CROSS-REFERENCE TO PRIOR APPLICATIONS

This application is the U.S. National Phase application under 35 U.S.C. §371 of International Application No. PCT/CA2012/050297, filed on May 4, 2012. This application is hereby incorporated by reference herein.

TECHNICAL FIELD

The invention relates to circuits for driving electrical loads. The invention has application, for example, in driving circuits for solid-state light emitters of which light-emitting diodes (LEDs) are one example.

BACKGROUND

An electrical load may be controlled by supplying control signals to a current-control device. The control signals may originate as digital signals and be converted to analog control signals by a digital-to-analog converter (DAC).

Offsets can interfere with the ideal operation of such drive circuits. For example, some DACs may provide a non-zero analog output signal even when the digital signal being converted specifies a zero output (positive offset). Some DACs may provide a zero output even when the digital signal being converted specifies a non-zero output (negative offset).

Such offsets can arise as a result of process variations in the manufacture of DACs. Consequently, two DACs of the identical type may exhibit different offsets. Other components in the signal path to the current-control device may also introduce offsets.

Even offsets that are small relative to the full range of the analog control signal can be problematic where fine control is required. For example, such offsets can make it impossible to determine the digital control signal necessary to effect the lowest possible non-zero current through an electrical load.

Offsets can be addressed by making circuits with high quality DACs and other components that have been selected to have very low or at least known offsets. However, high quality components are often much more expensive than standard components.

Another approach is to individually adjust circuits to compensate for offset in circuit components. Individual tuning of circuits significantly increases manufacturing cost and complicates manufacturing.

There is a need for cost-effective ways to compensate for offsets in DACs and other components of circuits used to drive electrical loads.

SUMMARY OF THE INVENTION

In one embodiment of the invention, a circuit for driving an electrical load comprises a current-control device connected in series with the load and a digital-to-analog converter having an output coupled to a control input of the current-control device by way of a gain block. The gain block comprises a first input coupled to receive a control voltage from the output of the digital-to-analog converter, a second input connected to receive a current feedback signal representing current in the electrical load, and an output coupled to the control input of the current-control device. The second input is biased to have a potential at least equal to a bias voltage. The bias voltage may be selected so that the bias voltage is equal to or greater than the worst-case expected offset voltage.

In some embodiments the first input of the gain block is a non-inverting input and the second input of the gain block is an inverting input.

In some embodiments the gain block comprises an operational amplifier.

In some embodiments there is a current sense resistor connected in series with the electrical load, and the current feedback signal comprises a voltage across the current sense resistor.

In some embodiments the current-control device comprises a field effect transistor.

In some embodiments there is a processor connected to write digital values to a register associated with the digital-to-analog converter, and the processor comprises a sensing input connectable to monitor the output of the gain block.

In some embodiments there is a program store containing a non-transitory set of computer software instructions, the computer software instructions including first instructions that, when executed by the processor cause the processor to write different digital values to the register and to determine an offset digital value such that, when the offset digital value is written to the register, the current-control device remains in an off state and the offset digital value is the largest digital value for which the current-control device remains in an off state.

In some embodiments the computer software instructions are configured to cause the processor to store a value indicative of the offset digital value in a data store.

In some embodiments the first instructions are configured to cause sequential digital values to be written into the register until the processor detects an increase in the output of the gain block by way of the sensing input.

In some embodiments the first instructions are configured to cause digital values to be written into the register according to a search algorithm, for example a binary search algorithm, to locate a pair of sequential digital values between which the processor detects an increase in the output of the gain block by way of the sensing input.

In some embodiments the computer software instructions comprise second instructions, the second instructions configured to map a first digital value to a second digital value and to write the second digital value to the register wherein the mapping maps first digital values in a first range of digital values to corresponding second digital values in a second range of digital values wherein the second range is smaller than the first range.

In some embodiments the electrical load comprises a solid-state light emitter.

In one embodiment of the invention, a circuit for driving a current-control device having a turn-on threshold to control electrical current through an electrical load comprises a gain block connected to receive a control signal from a digital-to-analog converter (DAC) and a reference voltage, the reference voltage comprising a feedback signal based on the instantaneous current flowing through the electrical load, the gain block comprising an output connected to the current-control device; a detector detecting a voltage at the output of the gain block; and, a controller configured to increase stepwise a control value in the DAC, monitor the voltage detected by the detector at the output of the gain block to detect an increase in the detected voltage corresponding to turn-on of the current-control device, determine a corresponding offset in the control value, and subsequently apply the offset to adjust the control value of the DAC to achieve a desired current through the electrical load.

In some embodiments the current-control device comprises a field effect transistor.

In some embodiments the gain block comprises an operational amplifier.

In some embodiments the electrical load comprises a solid-state light source.

Another aspect of the invention provides a method for determining offset in a driving circuit comprising a digital-to-analog converter. The method comprises writing a plurality of digital values to a register of the digital-to-analog converter and, for each of the digital values: applying an output of the digital-to-analog converter to a first input of a gain block while applying a bias voltage to a second input of the gain block; applying an output of the gain block to a control input of a current-control device; applying a current feedback signal to the second input of the gain block and monitoring the output of the gain block. From results of the monitoring of the output of the gain block for the plurality of digital values the method determines an offset digital value such that, when the offset digital value is written to the register, the current-control device remains in an off state and the offset digital value is the largest digital value for which the current-control device remains in the off state. The method records information indicative of the offset digital value. The recorded information may, for example, be the offset digital value, a number different from the offset digital value by a known amount (e.g. the offset digital value plus or minus one or plus or minus some other known amount, of the like), a transformation based on the offset digital value or the like.

Further aspects of the invention and features of specific embodiments of the invention are described below.

BRIEF DESCRIPTION OF THE DRAWINGS

The accompanying drawings illustrate non-limiting embodiments of the invention.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

Figure 1:
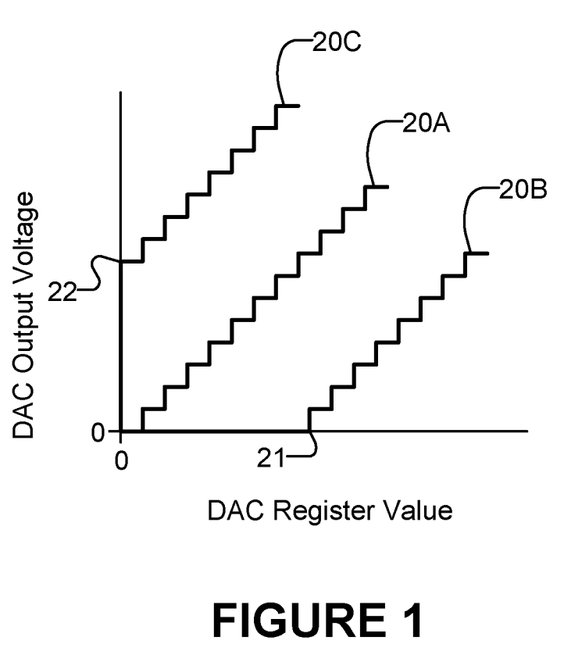
FIG. 1 is a set of curves showing analog output as a function of digital input for some example DACs.

FIG. 1 is a graph showing analog output as a function of digital input for a number of DACs. Curve 20A represents an output of an ideal DAC with zero offset. For a digital input of zero the analog output is also zero. Each time the digital input is increased by one the analog output steps up by one increment.

Curve 20B represents an output of a DAC with a negative offset. The output of the DAC remains zero until the digital input signal reaches a threshold 21. When the digital input has a value exceeding threshold 21 the analog output steps up by one increment each time the digital input is increased by one.

Curve 20C represents an output of a DAC with a positive offset. The output of the DAC has a non-zero value 22 even when the digital input signal is zero. Each time the digital input is increased by one the analog output steps up by one increment.

A particular DAC selected from a batch of DACs of the same type may have an offset as illustrated in any one of curves 20A, 20B and 20C. Furthermore, for DACs in the batch that have negative offset the value for threshold 21 may vary. For DACs in the batch that have positive offset the value for zero offset 22 may vary.

Figure 2:
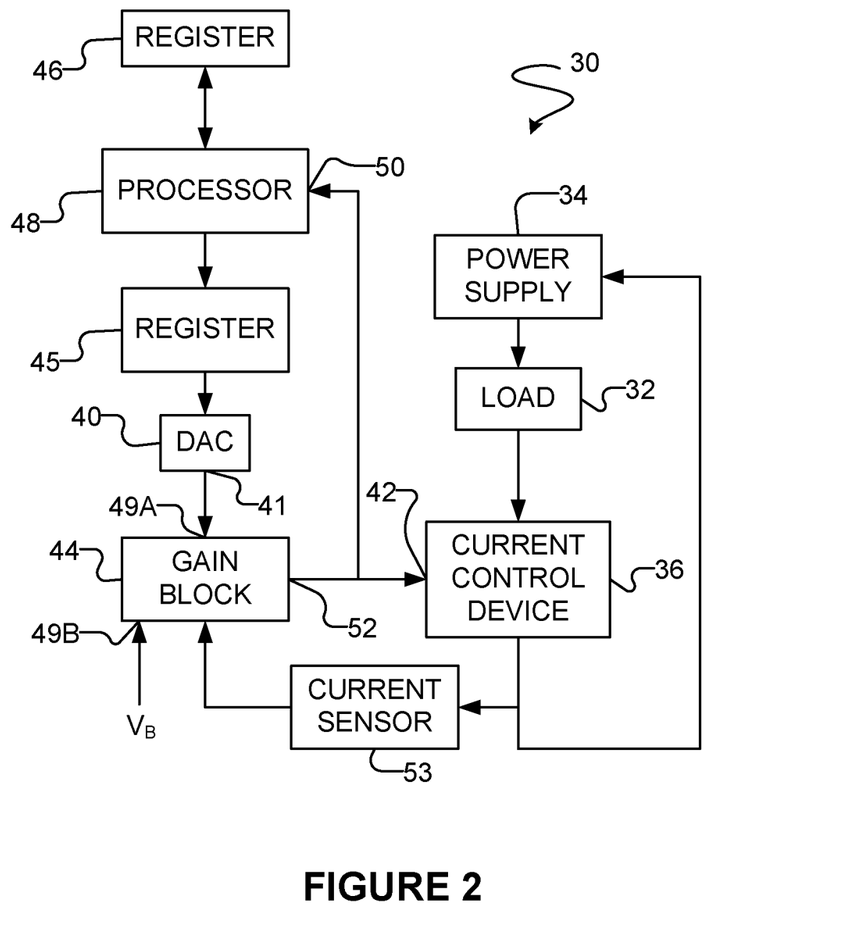
FIG. 2 is a block diagram of a driving circuit according to an example embodiment of the invention.

FIG. 2 is a block diagram of a driving circuit 30 for driving an electrical load 32. Load 32 may, for example, comprise a light source, such as a LED or a group of LEDs, a motor, an actuator, a switch or the like. Load 32 may comprise any load that offers resistance to the flow of electrical current (i.e. a load that is not purely reactive).

A power supply 34 provides electrical current to drive load 32. The magnitude of the current is controlled by a current-control device 36. Current-control device 36 may, for example, comprise a transistor (e.g. a field effect transistor ("FET"), a MOSFET, a bipolar junction transistor ("BJT"), an insulated gate bipolar transistor ("IGBT"), a Darlington transistor, or the like). It is convenient for current-control device 36 to be a voltage-controlled device but this is not mandatory. In some embodiments current control-device 36 comprises a current-controlled device such as a BJT.

A DAC 40 has an output 41 which is coupled to drive a control input 42 of current-control device 36 by way of a gain block 44. The voltage presented at output 41 is determined by a digital value in a register 45. In the illustrated embodiment a processor 48 writes digital values into register 45. The digital values correspond to desired driving currents for load 32. Initially the exact correlation between the digital value in register 45 and the resulting driving current is not known because of the possibility that DAC 40 and/or gain block 44 may introduce offsets.

In some embodiments, processor 48, register 45 and DAC 40 are integrated into one component. In other embodiments, processor 48 is in a first component and register 45 and DAC 40 are in a second component.

Gain block 44 may comprise any circuit providing a sufficient open-loop gain when operated. For example, in some embodiments, gain block 44 has an open-loop gain exceeding 1000. Any suitable amplifier circuit may be used to provide gain block 44. For example, as described below, gain block 44 may comprise an operational amplifier ("OP AMP"). The gain provided by gain block 44 is preferably greater than the ratio of the turn-on voltage of current control device 36 and the size of the voltage steps $V_{STEP}$ provided by DAC 40. For example, in a case where the turn-on voltage of current control device 36 is 1 volt and $V_{STEP}$ is 1 mV then gain block 44 preferably has a gain of at least 1V/1 mV=1000. In some embodiments the gain of gain block 44 is significantly more than this ratio (for example at least twice or at least three times or at least ten times the ratio).

Gain block 44 has a non-inverting input 49A and an inverting input 49B. A bias voltage $V_B$ is applied to the inverting input 49B. The bias voltage is selected to exceed the worst-case expected positive offset of DAC 40 (e.g. the bias voltage is set to be slightly more than the largest expected zero offset 22). The bias voltage may, for example, be provided by a voltage divider.

Gain block 44 has the property that its output 52 remains below a threshold (e.g. zero or negative) as long as the voltage at inverting input 49B exceeds the voltage at non-inverting input 49A. This property may be used to determine the total offset provided by DAC 40 and gain block 44 and/or other components in the driving circuit.

An input 50 to processor 48 is connected to sample the output of gain block 44. In some embodiments, input 50 is a digital input that detects either a logical LOW value or a logical HIGH value depending on whether or not a signal presented at its input is above a threshold value. In alternative embodiments, input 50 is an analog input.

Figure 3:
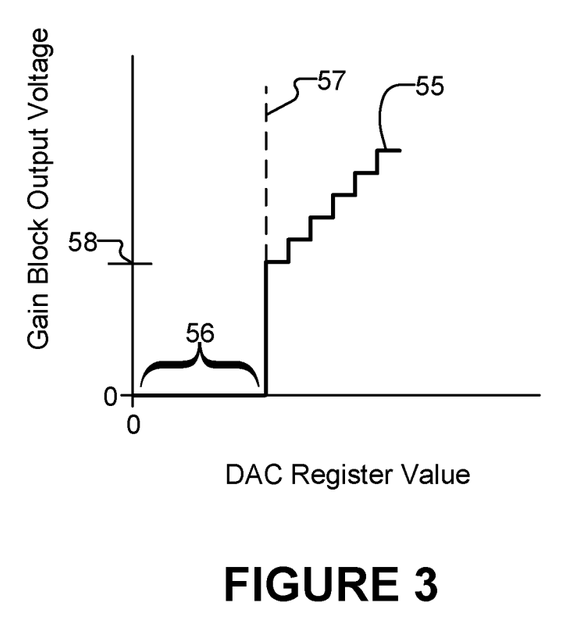
FIG. 3 is curve showing analog output as a function of digital input for the driving circuit in FIG. 2.

FIG. 3 is a graph showing an example curve 55 showing the relationship between the register value in register 45 and the analog voltage at output 52 of gain block 44 which controls the current through load 32. The following paragraphs describe an example mode of operation of the driving circuit shown in FIG. 2 for the example case of curve 55 of FIG. 3.

Consider how the voltage at output 52 of gain block 44 varies as the value in register 45 is increased from zero. Since the bias voltage at inverting input 49B of gain block 44 exceeds the worst-case expected positive offset of DAC 40 the voltage on inverting input 49B will initially exceed the voltage on non-inverting input 49A thereby forcing output 52 of gain block 44 to have zero output voltage. If the value in register 45 is stepwise increased then the voltage at output 52 will remain at zero as long as the output of DAC 40 that is presented at non-inverting input 49A remains less than the bias voltage. This will be the case for register values in range 56.

For a value 57 in register 45 the output of DAC 40 that is presented at non-inverting input 49A barely equals or exceeds the bias voltage presented at inverting input 49B. As a result, the voltage at output 52 of gain block 44 rises to a higher output voltage. Since gain block 44 has a high gain, the voltage at output 52 tends to rise quickly as a function of the voltage differential between non-inverting input 49A and inverting input 49B. This results in a voltage at output 52 increasing quickly as soon as the voltage at non-inverting input 49A starts to exceed the voltage at inverting input 49B. This voltage increase may be detected by processor 48 by monitoring its input 50. As discussed below, feedback representing the current in load 32 may be applied such that the voltage at output 52 quickly increases to a value 58 when the value 57 in register 45 is incremented to the first value such that the non-inverting input 49A equals or exceeds the bias voltage presented at inverting input 49B.

In the illustrated embodiment, gain block 44 is connected to receive feedback from a current sensor 53 indicative of the current flowing in load 32. The feedback may be applied to regulate the voltage at output 52. This is described in more detail below.

If the value in register 45 is increased stepwise past value 57 then output 52 of gain block 44 ramps up from voltage 58. The particular voltage present at output 52 of gain block 44 for a given value in register 45 will, in general, depend on the characteristics of gain block 44 and the feedback provided.

Figure 4:
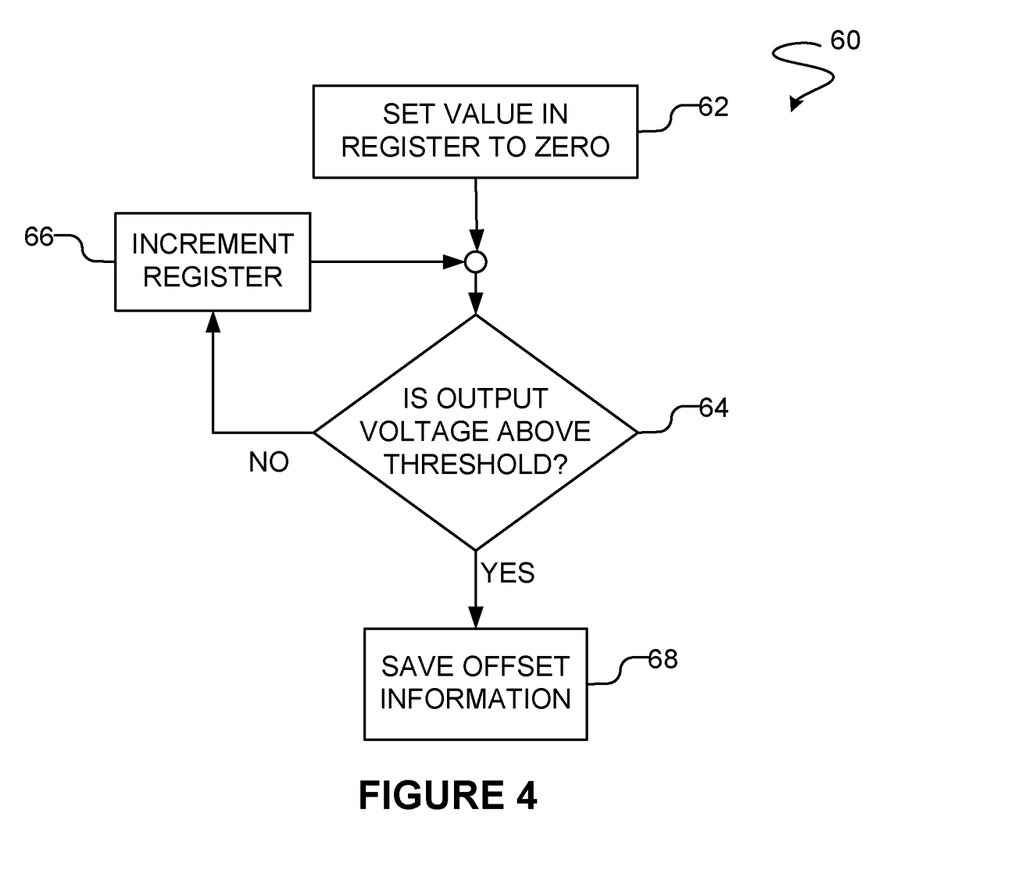
FIG. 4 is a flow chart illustrating an offset detection method.

FIG. 4 is a flow chart illustrating a method 60 for determining the offset that may be caused by offset in DAC 40 and/or gain block 44 and/or other components in the driving circuit. Method 60 may, for example, be performed by a processor operating under software control. Method 60 begins with an initialization block 62 that sets the value in register 45 to zero. In block 64 the voltage at the output 52 of gain block 44 is tested to determine if it is above a threshold that is lower than value 58. If not (NO result in block 64) then method 60 increments the value in register 45 in block 66 and loops back to block 64. If block 64 determines that the voltage of output 52 exceeds the threshold (YES result in block 64) then, in block 68, information characterizing the offset is stored in a register 46 (which may be any memory location accessible to processor 48). The information characterizing the offset may, for example, be the value in register 45 or a value one less than the value in register 45 or a function of the value in register 45, or a transformation based on the value in register 45 or the like.

As an alternative to initializing register 45 to a small value and incrementing the value in register 45 method 60 could initialize register 45 to a larger value and decrement the value in register 45. As a further alternative, method 60 could write values to register 45 according to a search algorithm operable to search for a register value corresponding to the offset. The search algorithm may comprise a binary search algorithm for example. These and other alternatives may be implemented, for example, by means of a by a processor (e.g. processor 48) operating under software control (e.g. according to software instructions stored in a program store accessible to processor 48).

Often the value of the offset will not change for a particular circuit and so method 60 may be performed once. Subsequently processor 48 may use the value in register 46 to control current through load 32.

Sometimes it may be desirable to perform method 60 more than once, for instance if the offset for a particular circuit changes. In some embodiments, method 60 may be performed as initiated by a user. In some embodiments, method 60 may be performed when a sensor measures a particular result. The sensor may comprise a timing device, a thermometer, an accelerometer, a light meter, or another type of sensors.

Figure 5:
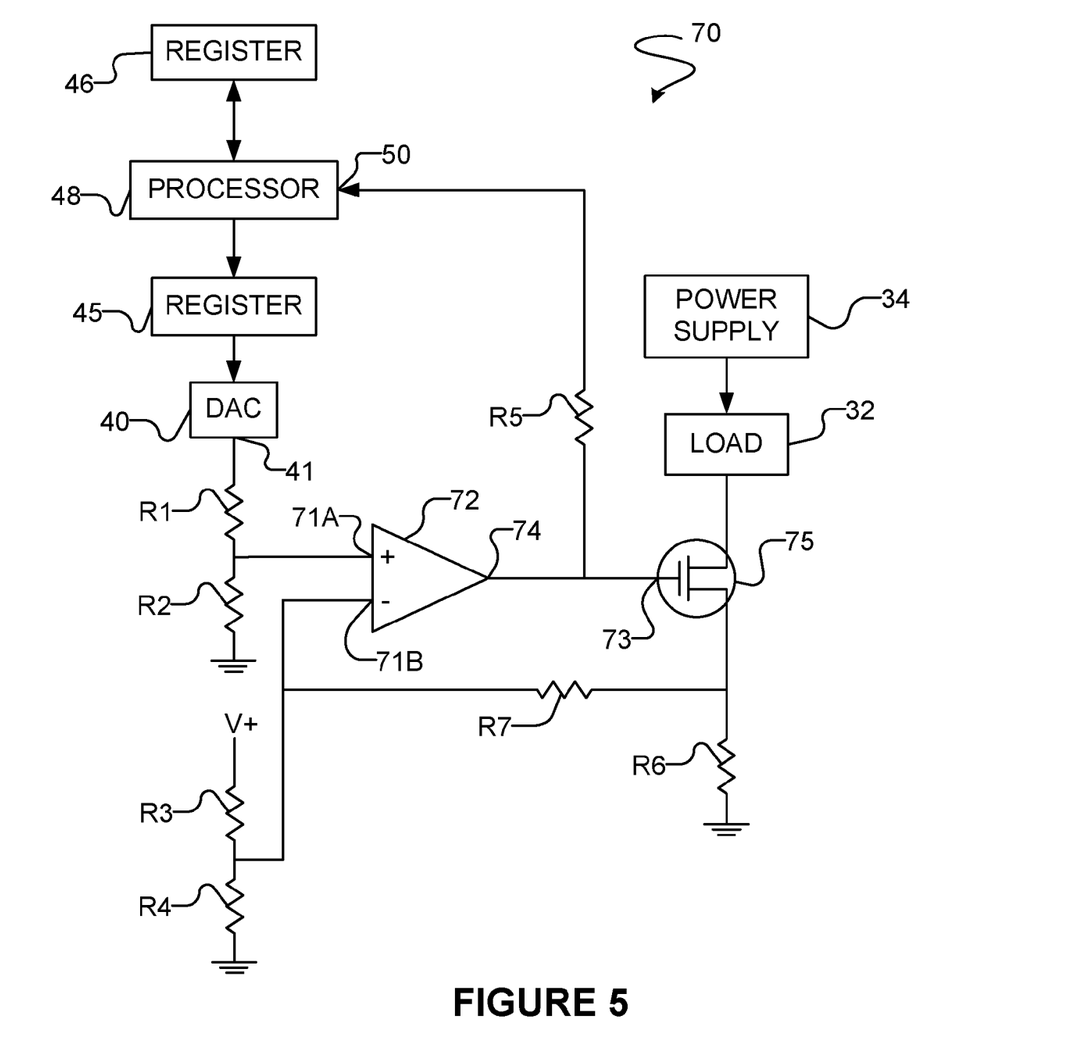
FIG. 5 is schematic diagram of a driving circuit according to a more specific example embodiment of the invention.

FIG. 5 is a schematic circuit diagram illustrating an example circuit 70 according to an embodiment of the invention. In circuit 70 output 41 of DAC 40 is connected to a non-inverting input 71A of an operational amplifier (OP AMP) 72.

In the illustrated embodiment the signal at output 41 is attenuated by a voltage divider comprising resistors R1 and R2 before it is applied to non-inverting input 71A.

The output 74 of OP AMP 72 is coupled to drive the gate 73 of a MOSFET 75 that serves as a current-control device. A bias voltage is applied to an inverting input 71B of OP AMP 72 by a voltage divider made up of resistors R3, R4, R6 and R7 connected between a power supply potential V+ and ground.

Output 74 is connected to digital input 50 of processor 48 by way of resistor R5. A current sense resistor R6 is provided in series with load 32. Feedback regarding the current flowing in load 32 is provided to inverting input 71B of OP AMP 72 by way of resistor R7.

In some embodiments, values for R1 and R2 are selected such that for a maximum output of DAC 40 the voltage at non-inverting input 71A of OP AMP 72 is approximately the same as the voltage developed across current-sensing resistor R6 at a maximum current flow through load 32. In a particular non-limiting example embodiment, a ratio of R1:R2 may be chosen to be 20:1 (e.g. R1=20 kΩ and R2=1 kΩ). In this case for a full-scale output of DAC 40 of e.g. 5V the corresponding voltage at non-inverting input 71A will be 238 mV. If the full-scale current through load 32 is 1 A and R6 is selected to be 0.237Ω (the closest standard value to 0.238Ω) the voltage drop across R6 at full-scale current will be 237 mV.

Values for R3, R4 and R7 may be chosen to provide a desired bias voltage at inverting input 71B and to provide suitable current feedback. For example, where the bias voltage should be 100 mV to equal or slightly exceed the worst-case expected offset then, if V+ is 5V, R3 and R6+R7 may be chosen to have a ratio of 49:1 to yield a 100 mV bias voltage. For example one might select R3=49 kΩ and R7=1 kΩ (R6 typically has a value much smaller than R3 or R7 so that it can be ignored for the case where no current is flowing in load 32). R4 is optional.

Where R4 is present then R4 may have a value significantly larger than the sum of R6 and R7. The value of R4 may be selected to fine-tune the bias voltage applied at inverting input 71B and also the gain of the feedback provided to OP AMP 72 (or another gain block) as a result of the voltage drop across R6.

Circuit 70 operates as follows. In this example, the value in register 45 which controls the output of DAC 40 will be described as being increased stepwise starting from zero as this provides a good way to explain the operation of circuit 70. However, it will be understood that whatever process is controlling the contents of register 45 may write arbitrary values into register 45.

OP AMP 72 in this example is a monopolar OP AMP. When the value in register 45 is a minimum value (e.g. zero) the voltage on non-inverting input 71A is, by design, less than the bias voltage on inverting input 71B. Consequently, output 74 has a minimum value (e.g. zero plus any offset provided by OP AMP 72). The voltage at output 74 is below the threshold required to turn MOSFET 75 on. Consequently, no current is flowing in load 32 and no significant current is flowing in current sense resistor R6.

This situation continues as the value in register 45 is stepwise increased until such time as the voltage applied at non-inverting input 71A exceeds the bias voltage on inverting input 71B. Since OP AMP 72 has a high gain, this voltage difference causes OP AMP 72 to increase the voltage on output 74. The voltage on output 74 is prevented from increasing to V+ by feedback from current sense resistor R6.

As the voltage of output 74 increases, it becomes larger than the threshold needed to turn MOSFET 75 on. Consequently, MOSFET 75 turns on and allows current to flow in load 32 and current sense resistor R6. This causes a voltage drop across current sense resistor R6 that, in turn, causes the potential at inverting input 71B of OP AMP 72 to rise. Output 74 therefore stabilizes at a voltage such that MOSFET 75 is on and is allowing just enough current to pass through load 32 and current sense resistor R6 such that the inverting input 71B is raised to the same potential as the non-inverting input 71A.

By selecting appropriate values for resistors R3, R4, R7 and current sense resistor R6 one can cause the current though load 32 corresponding to this 'turn-on threshold' value in register 45 to be a small current that is equal to or less than the lowest current that it is desired to control.

The voltage at output 74 corresponding to the turn-on threshold value in register 45 is sufficient to be detected at input 50 of processor 48. Input 50 is conveniently a digital input. An amplifier may optionally be provided to amplify the voltage at output 74 and apply the result to input 50 such that processor 48 can detect the turn-on threshold value (for example by a method like method 60 of FIG. 4).

As the value in register 45 is increased stepwise past the turn-on threshold value, for each step, OP AMP 72 causes the voltage at its output 74 to increase, thereby increasing the current through load 32 and current sense resistor R6, until feedback from the increased current causes the potential at the inverting input 71B to be raised to the same potential as the non-inverting input 71A at which point the voltage at output 74 stabilizes.

Processor 48 can thereby control the current through load 32 by placing values into register 45 that are in a range extending from the turn-on threshold value to some maximum value. Processor 48 can cause the current through load 32 to be shut off by writing a value to register 45 that is less than the turn-on threshold value.

Circuit 70 is given as an example only and may be varied in many ways while preserving the basic principles of operation described above. A few examples are:
  the current feedback to OP AMP 72 may include active electronic components (for example, an amplifier may be provided in place of R7 or in addition to R7);
  OP AMP 72 may be replaced by another type of high gain amplifier;
  the output of DAC 40 may be conditioned, amplified, attenuated or otherwise altered before it is applied to non-inverting input 71A (Note that any additional offset introduced by any additional conditioning circuits introduced between output 41 of DAC 40 and non-inverting input 71A can be determined and compensated for as described herein.);
  the bias voltage provided at inverting input 71B may be from a source other than a voltage divider;
  MOSFET 75 may be replaced with any other suitable current-control device;
  Current sense resistor R6 may be replaced with an alternative current sensor that can be applied to provide current feedback to OP AMP 72.
  It is not mandatory that an inverting input of the gain block be connected to receive the bias voltage and a non-inverting input of the gain block be connected to the output of DAC 40. In alternative embodiments these inputs are reversed and polarities of other circuit elements are changed to preserve circuit operation.
Such variations may be applied singly or in any suitable combination.

Figure 5A:
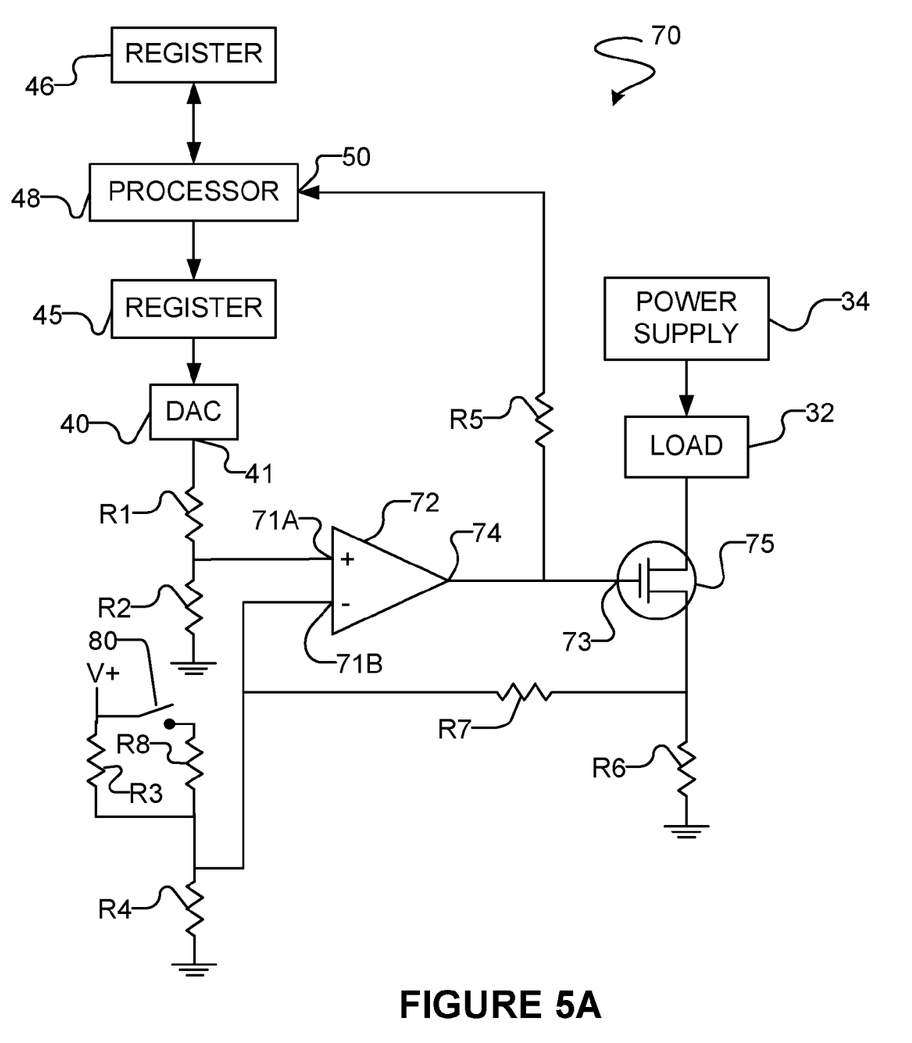
FIG. 5A is schematic diagram of a driving circuit according to a more specific example embodiment of the invention.

FIG. 5A is a schematic diagram illustrating an example circuit 70A according to an alternative embodiment. Circuit 70A is similar to circuit 70 shown in FIG. 5 except that the bias voltage applied to the inverting input of the gain block (provided in this example by op amp 72) can be varied. In the illustrated embodiment a switch 80 controlled by processor 48 permits selectively connecting resistor R8 in parallel with R3. When switch 80 is closed then R8 is connected in parallel with R3 so that more voltage is dropped across R4, R6 and R7, thus increasing the bias voltage at inverting input 71B of the gain block. Thus, a first bias voltage is applied to input 71B when switch 80 is open and a second bias voltage greater than the first bias voltage is applied to input 71B when switch 80 is closed.

Circuit 70A may be used to obtain additional information regarding the performance of DAC 40 and the gain block. For example, one can determine the value (a "second calibration value") that can be written to register 45 to cause the current-control device (in this example MOSFET 75) to barely turn on with switch 80 closed (e.g. the value one greater than the highest value for which MOSFET 75 remains off with switch 80 closed).

In some embodiment, the second calibration value is applied to assist in compensating for the case where the gain of DAC 40 is not accurately known (e.g. where there is a variability in $V_{STEP}$ among DACs of the same type as DAC 40).

In an example embodiment, processor 48 executes instructions that cause the processor to determine the second calibration value by a method comprising: closing switch 80, writing different values to register 45, and monitoring by way of input 50 the voltage at output 74 for each of the register values. In some embodiments a range of values within which the second calibration value should be found is known in advance from the known bias voltage applied when switch 80 is closed and the known characteristics of DAC 40. In such embodiments the values written to register 45 may be selected to be in the range. In some embodiments processor 48 determines the second calibration value by sequentially incrementing or decrementing the value in register 45. This is not necessary. Other search strategies may be applied to determine the second calibration value.

In an example embodiment, processor 48 is configured to determine $V_{STEP}$ from the first and second calibration values and their corresponding bias voltages. This may be done, for example, by subtracting the first bias voltage from the second bias voltage and dividing the result by the difference between the first and second calibration values.

Other embodiments may provide more than two different bias voltages. Such embodiments may obtain additional calibration values in the same manner as described above to enable the performance of DAC 40 to be better characterized. Selection among the different bias voltages may be controlled by processor 48.

It is convenient but not mandatory that the bias voltages be provided by way of voltage dividers. In alternative embodiments, bias voltages for use in obtaining one or more calibration values are provided by voltage regulators, Zener diodes, external calibrated power supplies or other suitable sources of reference voltage.

The use of two or more selectable bias voltages may be applied in any other embodiment as described herein. For example, apparatus as shown in FIG. 2 may be modified to provide a selectable bias voltage at an input of gain block 44.

In embodiments where it is desired to determine offset only once, a lasting connection to input 50 is not required. In such embodiments, an alternative is to detect an increase in voltage at output 74 and/or a current flowing in load 32 using an external test device in data communication with processor 48. The external test device may provide a signal to processor 48 when the turn-on threshold has been reached. Test points may be provided to connect the external test device. In some embodiments the external test device may supply one or more bias voltages to test points connected to apply the bias voltages to an input of a gain block.

In an illustrative example embodiment, DAC 40 is configured to accept register values in the range of 0 to 1023. Consider the case when the maximum output of DAC 40 is 10.23V (this value is selected for convenience in this example only). In this case, if the output of DAC 40 is linear, and if DAC 40 has no offset, then the output of DAC 40 is given by:

$$V_{OUT} = D_V \times V_{STEP} = \frac{D_V}{100}$$

where $V_{OUT}$ is the output voltage of DAC 40 and $D_V$ is the value stored in register 45. The output of DAC 45 can therefore be changed with a step size, $V_{STEP}$, which is 0.01 volts in this example.

Consider now the case where DAC 40 has a negative offset (e.g. the output of DAC 40 is 0V for $D_V \in [0, M]$ and increases linearly for values of $D_V > M$). In this example, the output of DAC 40 is given by:

$$V_{OUT} = 0 \text{ for } D_V \leq M$$

$$V_{OUT} = (D_V - M)V_{STEP} = \frac{D_V - M}{100} \text{ for } D_V > M.$$

Consider now the case where DAC 40 has a positive offset (e.g. the output of DAC 40 is $V_X$, where $V_X$ is greater than zero, for $D_V = 0$). In this example, the output of DAC 40 is given by:

$$V_{OUT} = (D_V \times V_{STEP}) + V_X = \frac{D_V}{100} + V_X \text{ for } D_V < 1023 - \frac{V_X}{V_{STEP}}$$

$$V_{OUT} = V_{MAX} = 10.23 \text{ V for } D_V \geq \left(1023 - \frac{V_X}{V_{STEP}}\right)$$

where $V_{STEP}$ is the voltage step size as described above and $V_{MAX}$ is the maximum output voltage. In this example case $V_{MAX}=10.23$V and $V_{STEP}=10.23\text{V}/1023=0.01\text{V}$.

Bias voltage $V_B$ may be chosen to be slightly greater than V. Where circuits as described herein are being produced in volume, the offsets in individual circuits will vary as a result of variations in components from circuit to circuit. It is generally possible to establish a worst-case positive offset such that, to a desired degree of confidence, the actual offset of a particular circuit will be less than the worst-case positive offset. In this case, the circuits may be designed to provide a bias voltage that is slightly greater than the worst-case value of V.

With this choice of bias voltage $V_B$, if DAC 40 has a negative offset M, current-control device 36 will be in an "on" state if and only if $D_V$ is greater than or equal to $(V_B/V_{STEP})+M+1$. Therefore, the full range of input values for DAC 40 (0 to 1023 in this example) is not usable to control the electrical load. The controlled load may receive a non-zero current for register values in the range of:

$$\frac{V_B}{V_{STEP}} = M + 1 \leq D_V \leq 1023 - \left(\frac{V_X}{V_{STEP}}\right).$$

Some embodiments map input values in a valid input range (e.g. 0 to 1023 in this example) into a reduced range. The reduced range may be a single range selected to be valid for all DACs having offsets between a worst-case negative offset and a worst-case positive offset. In such embodiments, compensating for the offset may comprise mapping an input value into the reduced range according to a transformation and adding the offset digital value to the result. In some embodiments a reduced range may be determined separately for each DAC based on the offset information obtained, for example by method 60.

Circuits and methods as described herein have a wide range of applications. An example application is in driving solid-state light sources such as LED light sources. In some applications a processor may control multiple solid-state light sources. For example, the processor may be connected to control sources of red, green and blue (R, G and B) light sources in such a manner that the light from the R, G and B light sources mixes together in a way that viewers perceive a desired colour. Different offsets as between the R, G and B light sources may cause the R, G and B light sources to not all be on when the processor attempts to control them to emit a low level of light. This can cause the perceived colour to be wrong.

In such applications, a processor may be configured to determine the turn-on threshold value for each separately controlled light source or set of light sources. These turn-on threshold values may be recorded and subsequently applied by the processor in the control of the light sources. For example, the processor may determine desired digital driving values for each of the light sources, add to those values the corresponding turn-on threshold values (or one less than the corresponding turn-on threshold values), and write the results into control registers 45 corresponding to the different light sources.

Certain implementations of the invention comprise computer processors which execute software instructions which cause the processors to perform a method of the invention. For example, one or more processors in a light controller or a controller for another type of electrical load may implement a method 60 like that shown in FIG. 4 executing software instructions in a program memory accessible to the processor(s). The invention may also be provided in the form of a program product. The program product may comprise any medium which carries a set of computer-readable signals comprising instructions which, when executed by a data processor, cause the data processor to execute a method of the invention. Program products according to the invention may be in any of a wide variety of forms. The program product may comprise, for example, non-transitory physical media such as magnetic data storage media including floppy diskettes, hard disk drives, optical data storage media including CD ROMs, DVDs, electronic data storage media including ROMs, flash RAM, or the like. The computer-readable signals on the program product may optionally be compressed or encrypted.

Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

Embodiments of the invention may be implemented using specifically designed hardware, configurable hardware, programmable data processors configured by the provision of software (which may optionally comprise 'firmware') capable of executing on the data processors, special purpose computers or data processors that are specifically programmed, configured, or constructed to perform one or more steps in a method as explained in detail herein and/or combinations of two or more of these. Examples of specifically designed hardware are: logic circuits, application-specific integrated circuits ("ASICs"), large scale integrated circuits ("LSIs"), very large scale integrated circuits ("VLSIs") and the like. Examples of configurable hardware are: one or more programmable logic devices such as programmable array logic ("PALs"), programmable logic arrays ("PLAs") and field programmable gate arrays ("FPGAs")). Examples of programmable data processors are: microprocessors, digital signal processors ("DSPs"), embedded processors, graphics processors, math co-processors, general purpose computers, server computers, cloud computers, mainframe computers, computer workstations, and the like. For example, one or more data processors in a control circuit for a device may implement methods as described herein by executing software instructions in a program memory accessible to the processors.

Processing may be centralized or distributed. Where processing is distributed, information including software and/or data may be kept centrally or distributed. Such information may be exchanged between different functional units by way of suitable data communications paths.

While processes or blocks are presented in a given order, alternative examples may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways.

In addition, while elements are at times shown as being performed sequentially, they may instead be performed simultaneously or in different sequences.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

Specific examples of systems, methods and apparatus have been described herein for purposes of illustration. These are only examples. The technology provided herein can be applied to systems other than the example systems described above. Many alterations, modifications, additions, omissions and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

It is therefore intended that the following appended claims and claims hereafter introduced are interpreted to include all such modifications, permutations, additions, omissions and sub-combinations as may reasonably be inferred. The scope of the claims should not be limited by the preferred embodiments set forth in the examples, but should be given the broadest interpretation consistent with the description as a whole.

What is claimed is:

1. A circuit for driving a current-control device having a turn-on threshold to control electrical current through an electrical load, the circuit comprising:

a gain block connected to receive a control signal from a digital-to-analog converter (DAC) and a reference voltage, the reference voltage comprising a current feedback signal based on the instantaneous current flowing through the electrical load, the gain block comprising an output connected to the current-control device;

a detector detecting a voltage at the output of the gain block; and, a controller configured to:
 change a control value in the DAC,
 monitor the voltage detected by the detector at the output of the gain block to detect an increase in the detected voltage corresponding to turn-on of the current-control device, and
 determine a corresponding offset in the controller value.

2. A circuit according to claim 1 wherein the controller is configured to apply the offset to adjust the control value of the DAC to achieve a desired current through the electrical load.

3. A circuit according to claim 2 wherein the gain block comprises a non- inverting input connected to receive the control signal from the digital-to- analog converter and an inverting input connected to receive the reference voltage.

4. A circuit according to claim 3 wherein the gain block comprises an operational amplifier.

5. A circuit according to claim comprising a current sense resistor connected in series with the electrical load wherein the current feedback signal comprises a voltage across the current sense resistor.

6. A circuit according to claim 1 wherein the current-control device comprises a field effect transistor.

7. A circuit according to claim 1 wherein the controller is configured to change the control value by increasing the control value stepwise.

8. A circuit according to claim 1 wherein the controller comprises a data processor connected to write digital values to a register associated with the digital-to-analog converter and the detector comprises a sensing input of the data processor connectable to monitor the output of the gain block.

9. A circuit according to claim 8 wherein the sensing input comprises a digital input.

10. A circuit according to claim 8 wherein the sensing input comprises an analog input connected to an analog-to-digital converter.

11. A circuit according to claim 8 comprising a program store containing a non-transitory set of computer software instructions, the computer software instructions including first instructions that, when executed by the data processor cause the data processor to write different digital values to the register and to determine an offset digital value such that, when the offset digital value is written to the register, the current-control device remains in an off state and the offset digital value is the largest digital value for which the current-control device remains in the off state.

12. A circuit according to claim 11 wherein the computer software instructions are configured to cause the processor to store a value indicative of the offset digital value in a data store.

13. A circuit according to claim 11 wherein the first instructions are configured to cause sequential digital values to be written into the register unto the processor detects an increase in the output of the gain block by way of the sensing input.

14. A circuit according to claim 11 wherein the first instructions are configured to cause digital values to be written into the register according to a search algorithm configured to determine a pair of adjacent digital values between which the processor detects an increase in the output of the gain block from an initial value by way of the sensing input.

15. A circuit according to claim 14 wherein the search algorithm comprises a binary search algorithm.

16. A circuit according to claim 11 wherein the computer software instructions comprise second instructions, the second instructions configured to map a first digital value to a second digital value and to write the second digital value to the register wherein the mapping maps first digital values in a first range of digital values to corresponding second digital values in a second range of digital values wherein the second range is smaller than the first range.

17. A circuit according to claim 1 wherein the electrical load comprises a solid-state light emitter.

18. An apparatus comprising a plurality of circuits according to claim 1 each of the plurality of circuits operable to drive a corresponding one of a plurality of electrical loads, wherein the processor is common plurality of circuits.

19. Apparatus according to claim 18 wherein each of the plurality of electrical loads comprises one or more solid-state light emitters.

20. Apparatus according to claim 19 wherein the solid-state light emitters of different ones of the plurality of electrical loads are configured to emit light of different chromaticities.

21. An apparatus according to claim 20 wherein the apparatus is configured to switch each of the solid-state light emitters from an "off" state to a lowest "on" state substantially simultaneously.

22. A circuit according to claim 1 comprising first and second reference voltage supplies and a switch configured to selectively connect one of the first and second reference voltage supplies to the gain block wherein the switch is connected to be controlled by the controller.

* * * * *